United States Patent
Kim

(10) Patent No.: US 9,985,176 B2
(45) Date of Patent: May 29, 2018

(54) LIGHT EMITTING DIODE WITH REFLECTIVE PART FOR UVA AND BLUE WAVELENGTHS

(71) Applicant: Lumens Co., Ltd., Yongin-si, Gyeonggi-do (KR)

(72) Inventor: Dae Won Kim, Yongin-si (KR)

(73) Assignee: Lumens Co., Ltd., Yongin-si (KR)

( * ) Notice: Subject to any disclaimer, the term of this patent is extended or adjusted under 35 U.S.C. 154(b) by 0 days. days.

(21) Appl. No.: 15/693,159

(22) Filed: Aug. 31, 2017

(65) Prior Publication Data

US 2018/0069152 A1  Mar. 8, 2018

Related U.S. Application Data

(63) Continuation of application No. 15/356,262, filed on Nov. 18, 2016, now Pat. No. 9,853,187.

(30) Foreign Application Priority Data

Mar. 17, 2016 (KR) .................. 10-2016-0032026
May 13, 2016 (JP) ........................... 2016-097186

(51) Int. Cl.
*H01L 33/10* (2010.01)
*H01L 33/32* (2010.01)

(52) U.S. Cl.
CPC ............ *H01L 33/10* (2013.01); *H01L 33/325* (2013.01)

(58) Field of Classification Search
None
See application file for complete search history.

(56) References Cited

U.S. PATENT DOCUMENTS

| 5,838,707 A * | 11/1998 | Ramdani ............. H01S 5/18341 372/36 |
| 2006/0145137 A1* | 7/2006 | Wang ..................... B82Y 10/00 257/14 |

(Continued)

*Primary Examiner* — Lex Malsawma
(74) *Attorney, Agent, or Firm* — Polsinelli PC

(57) ABSTRACT

Disclosed is a light emitting diode using light of a short wavelength band. The light emitting diode includes a first conductivity type semiconductor layer having a front side and a back side, a second conductivity type semiconductor layer having a front side and a back side, an active layer formed between the back side of the first conductivity type semiconductor layer and the front side of the second conductivity type semiconductor layer, a first electrode electrically connected to the first conductivity type semiconductor layer, a second conductivity type reflective layer formed on the back side of the second conductivity type semiconductor layer, and a reflective part formed on the second conductivity type reflective layer to reflect light of a short wavelength band and light of a blue wavelength band and electrically connected to the second conductivity type semiconductor layer. The second conductivity type reflective layer includes DBR unit layers. Each of the DBR unit layers includes a low refractive index layer and a high refractive index layer adjacent to the low refractive index layer. The low refractive index layer and the high refractive index layer include $Al_xGa_{1-x}N$ ($0<x\leq1$) and $Al_yGa_{1-y}N$ ($0\leq y<1$, $y<x$), respectively.

12 Claims, 6 Drawing Sheets

(56) References Cited

U.S. PATENT DOCUMENTS

| | | | |
|---|---|---|---|
| 2007/0285000 A1* | 12/2007 | Lim | G02F 1/133603 |
| | | | 313/501 |
| 2008/0128745 A1* | 6/2008 | Mastro | H01L 31/078 |
| | | | 257/184 |
| 2009/0001389 A1* | 1/2009 | Wang | H01L 27/15 |
| | | | 257/89 |
| 2013/0146907 A1* | 6/2013 | Lunev | H01L 33/32 |
| | | | 257/94 |

* cited by examiner

LIGHT EMITTING DIODE WITH REFLECTIVE PART FOR UVA AND BLUE WAVELENGTHS

CROSS-REFERENCE TO RELATED APPLICATIONS

The present application is a continuation of U.S. patent application Ser. No. 15/356,262 filed on Nov. 18, 2016 which claims priority to Korean Patent Application No. KR 10-2016-0032026 filed in the Republic of Korea on Mar. 17, 2016, and to Japanese Patent Application No. JP 2016-097186 filed in Japan on May 13, 2016, all of which are hereby incorporated by reference in their entireties.

BACKGROUND

Field of the Disclosure

The present invention relates to a light emitting diode, and more specifically to a white light emitting diode including a p-type semiconductor layer, a conductivity type reflective layer formed on the p-type semiconductor layer to reflect light of a short wavelength band propagating through the p-type semiconductor layer, and a metal electrode formed on the conductivity type semiconductor layer to further reflect light of a short wavelength band and light of a visible wavelength band.

Description of the Background

Generally, nitrides of Group III elements, such as gallium nitride (GaN) and aluminum nitride (AlN), have recently received much attention as materials for visible and ultraviolet light emitting devices due to their good thermal stability and direct transition type energy band structure. Particularly, blue and green light emitting devices using indium gallium nitride (InGaN) are utilized in various applications, including large-area full-color flat panel displays, traffic signal lamps, indoor lighting systems, high-density light sources, high-resolution output systems, and optical communications.

It is difficult to grow a nitride semiconductor layer of a Group III element on a substrate made of the same material. Due to this difficulty, a nitride semiconductor layer of a Group III element is grown on a substrate made of a dissimilar material with a similar crystal structure by a suitable process, metal organic chemical vapor deposition (MOCVD) or molecular beam epitaxy (MBE). A sapphire substrate having a hexagonal system structure is mainly used as the dissimilar substrate. However, sapphire is an electrical insulator, limiting the structure of a light emitting diode. A technique for fabricating a vertical light emitting diode with high efficiency has been recently developed in which epitaxial layers, such as nitride semiconductor layers, are allowed to grow on a growth substrate made of a dissimilar material, such as sapphire, a support substrate is bonded to the epitaxial layers, and the growth substrate is separated by a suitable process, such as a laser lift-off process. According to this technique, a vertical light emitting diode is fabricated by sequentially forming an n-type GaN layer, an active layer, and a p-type GaN layer on a sapphire substrate as a growth substrate, forming a p-type ohmic electrode or an ohmic reflective layer on the p-type GaN layer, bonding a support substrate thereon, removing the sapphire substrate, and forming an electrode pad on the exposed n-type compound semiconductor layer.

On the other hand, a flip-chip light emitting diode has been developed that achieves high luminance and high output without the need for bonding wires to the sides of an electrode pad. The flip-chip light emitting diode is generally constructed such that light is emitted through a sapphire substrate rather than through a p-type semiconductor layer. This construction enables the use of a thick p-type electrode, ensuring good current spreading in the p-type semiconductor layer. In addition, heat can be dissipated through the sub mount substrate, resulting in a significant reduction in thermal resistance.

In the flip-chip light emitting diode and the vertical light emitting diode, light emitted from the active layer to the p-type semiconductor layer should be reflected towards the substrate. The formation of a reflective layer is necessary for the reflection of light emitted to the p-type semiconductor layer. A metal electrode is generally used to perform the function of the reflective layer.

SUMMARY

An object of the present invention is to provide a light emitting diode with improved light extraction efficiency that uses light of a short wavelength band that is free from many disadvantages associated with the use of aluminum in conventional light emitting diodes.

A further object of the present invention is to provide a light emitting diode constructed to include a first reflective layer for reflecting light of a short wavelength band and a second reflective layer for reflecting light of a short wavelength band and light of a blue wavelength band such that the light emitting diode has high reflectance in a broad wavelength region, including light of a short wavelength band, achieving improved light extraction efficiency.

According to one aspect of the present invention, a light emitting diode includes a first conductivity type semiconductor layer having a front side and a back side, a second conductivity type semiconductor layer having a front side and a back side, an active layer formed between the back side of the first conductivity type semiconductor layer and the front side of the second conductivity type semiconductor layer, a second conductivity type reflective layer formed on the back side of the second conductivity type semiconductor layer, and a reflective part formed on the back side of the second conductivity type reflective layer opposite the second conductivity type semiconductor layer to reflect light of a short wavelength (UVA wavelength) band and light of a blue wavelength band and electrically connected to the second conductivity type semiconductor layer wherein the second conductivity type reflective layer includes distributed bragg reflector (DBR) unit layers for reflecting light of a short wavelength (UVA wavelength) band of 315 nm to 420 nm, each of the DBR unit layers includes a low refractive index layer and a high refractive index layer adjacent to the low refractive index layer, the low refractive index layer and the high refractive index layer include $Al_xGa_{1-x}N$ (0<x≤1) and $Al_yGa_{1-y}N$ (0≤y<1, y<x), respectively, the DBR unit layers are repeated in at least triplicate in the second conductivity type reflective layer, and when the total doping concentration of the second conductivity type dopant in the initial three DBR unit layers placed closest to the back side of the second conductivity type semiconductor layer and the total doping concentration of the second conductivity type dopant in the other DBR unit layers are defined as first and second doping concentrations, respectively, the first doping concentration is lower than the second doping concentration.

According to one embodiment, a phase-matching layer is formed between the second conductivity type semiconductor layer and the second conductivity type DBR.

According to one embodiment, the first doping concentration is from $1\times10^{16}$ cm$^{-3}$ to $5-10^{17}$ cm$^{-3}$ and the second doping concentration is from $1\times10^{18}$ cm$^{-3}$ to $1\times10^{21}$ cm$^{-3}$.

According to one embodiment, the doping concentration of the second conductivity type dopant in the DBR unit layer placed closest to the reflective part as a second electrode is from $5\times10^{18}$ cm$^{-3}$ to $1\times10^{21}$ cm$^{-3}$ and is higher than those in the other DBR unit layers to achieve improved ohmic contact.

According to one embodiment, the second electrode includes a second conductivity type intermediate layer for improving ohmic contact and a reflective metal layer for reflecting light of a short wavelength band and light of a blue wavelength band.

According to one embodiment, the reflective metal layer includes silver.

According to one embodiment, a sapphire, SiC, Si, glass or ZnO substrate is located on the front side of the first conductivity type semiconductor layer.

According to one embodiment, the first conductivity type semiconductor layer is an n-type semiconductor layer and the second conductivity type semiconductor layer is a p-type semiconductor layer.

According to one embodiment, each of the DBR unit layers of the second conductivity type reflective layer includes a first transition portion formed between the low refractive index layer and the high refractive index layer and whose Al content gradually decreases from the front to the back and a second transition portion formed between the high refractive index layer and the low refractive index layer of the next adjacent DBR unit layer and whose Al content gradually increases from the front to the back.

According to one embodiment, delta doping may be applied to the starting and end points of each of the first transition portion and the second transition portion.

According to one embodiment, the second conductivity type reflective layer has a thickness of 60 nm to 1500 nm.

According to one embodiment, each of the DBR unit layers has a thickness of 60 nm to 100 nm.

According to one embodiment, each of the low refractive index layers and the high refractive index layers of the DBR unit layers has a thickness of 30 nm to 50 nm.

According to one embodiment, the second conductivity type intermediate layer has a thickness of 10 nm to 150 nm.

According to one embodiment, the phase-matching layer includes $Al_xGa_{1-x}N$ (0<x<1).

According to one embodiment, the phase-matching layer has a thickness of 5 nm to 50 nm.

According to one embodiment, the Al content of each of the first transition portions and the second transition portions may vary linearly or in the form of a quadratic curve.

As described above, the light emitting diode of the present invention is constructed to include a first reflective layer for reflecting light of a short wavelength band and a second reflective layer for reflecting light of a short wavelength band and light of a blue wavelength band. Due to this construction, the light emitting diode of the present invention has high reflectance in a broad wavelength region, including UVA and blue wavelength bands, achieving further improved light extraction efficiency.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
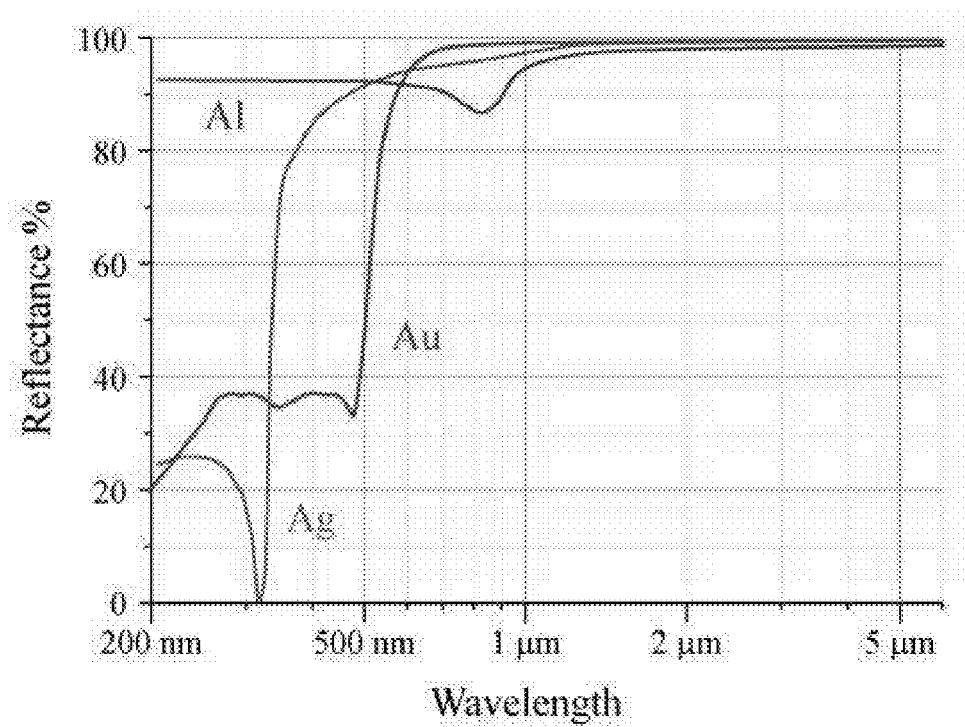
FIG. 1 shows wavelength-dependent changes in the reflectance of aluminum (Al) and silver (Ag)

A metal electrode including silver (Ag) may be used as a reflective layer. However, silver has substantially low reflectance values in the UVA wavelength band of 315 nm to 420 nm despite its very high reflectance in the blue wavelength band, as shown in FIG. 1. Accordingly, the use of silver as a material for a reflective layer is not suitable for the fabrication of a white light emitting diode using the UVA wavelength band.

Aluminum (Al) may be used as a material for a reflective layer or electrode for reflecting light of a UVA wavelength band. Aluminum (Al) has high reflectance values in the UVA wavelength band, as shown in FIG. 1, but has poor ohmic contact with a p-type semiconductor layer. The use of an aluminum electrode involves the use of a diffusion barrier layer, together with a process for forming the diffusion barrier layer.

Figure 2:
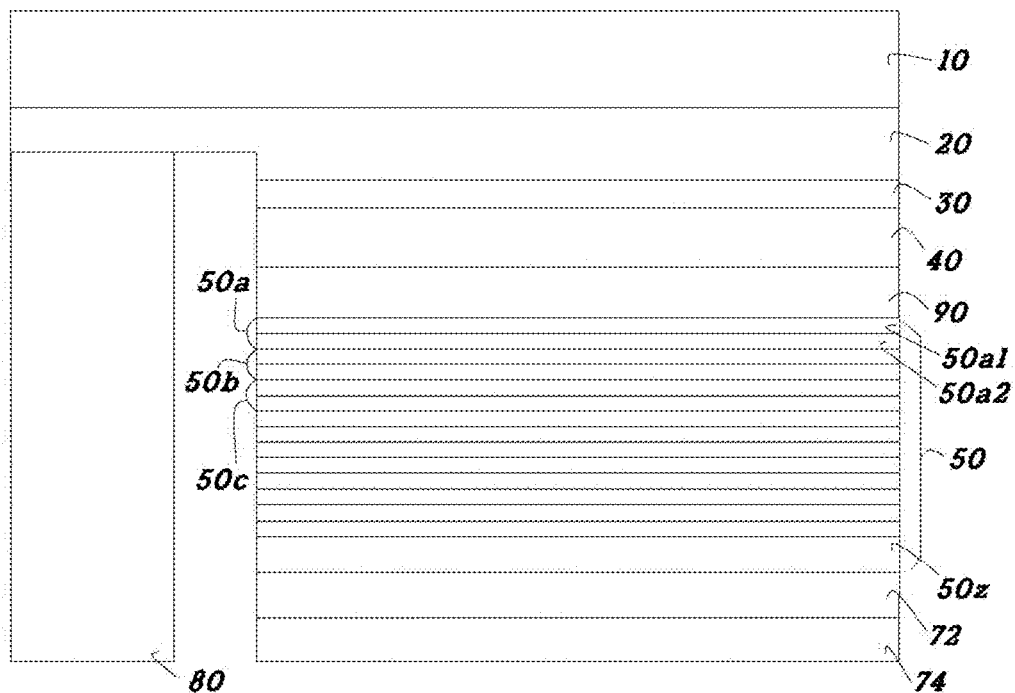
FIG. 2 is a longitudinal sectional view of a light emitting diode according to one embodiment of the present invention.
Figure 3:
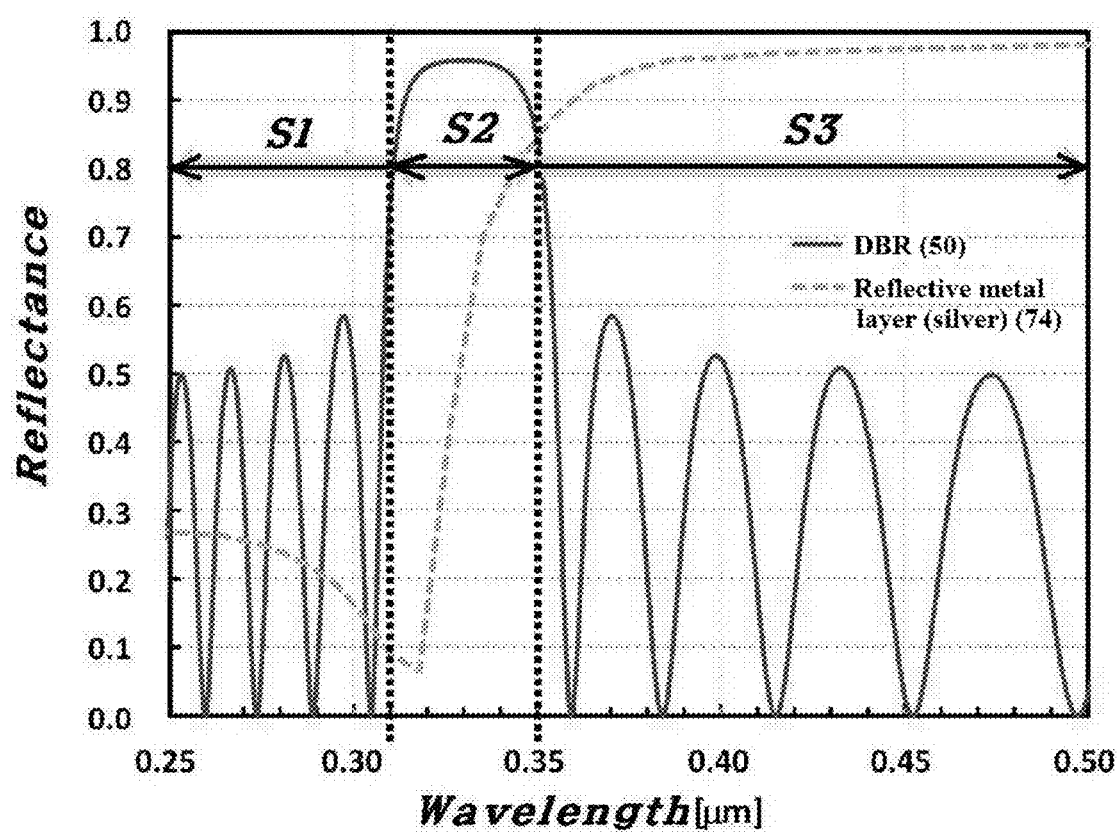
FIG. 3 shows wavelength-dependent changes in the reflectance of a light emitting diode according to one embodiment of the present invention.
Figure 4:
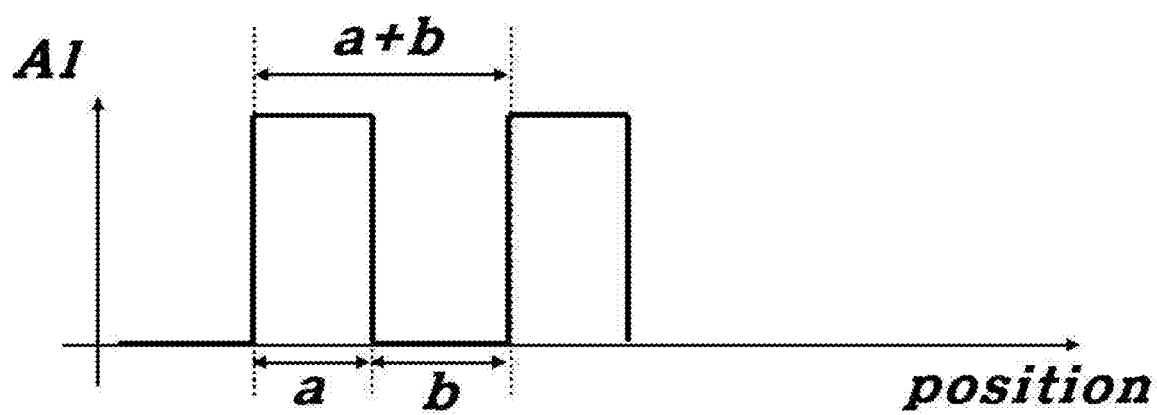
FIG. 4 shows an example of position-dependent changes in the aluminum (Al) content of low refractive index layers and high refractive index layers of DBR unit layers constituting a second conductivity type reflective layer of a light emitting diode according to one embodiment of the present invention.
Figure 5:
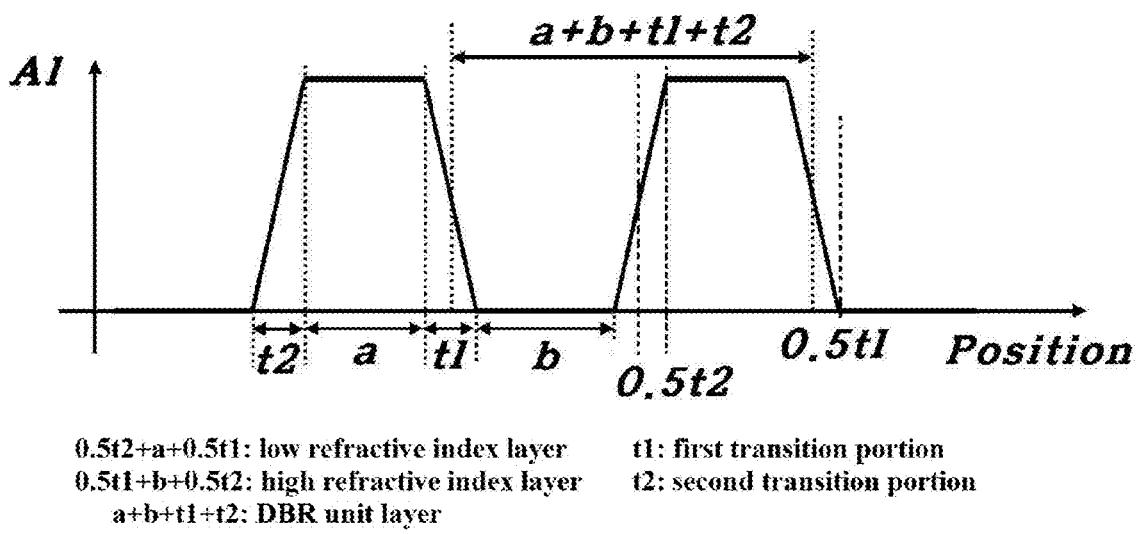
FIG. 5 shows a further example of position-dependent changes in the aluminum (Al) content of low refractive index layers and high refractive index layers of DBR unit layers constituting a second conductivity type reflective layer of a light emitting diode according to one embodiment of the present invention.
Figure 6:
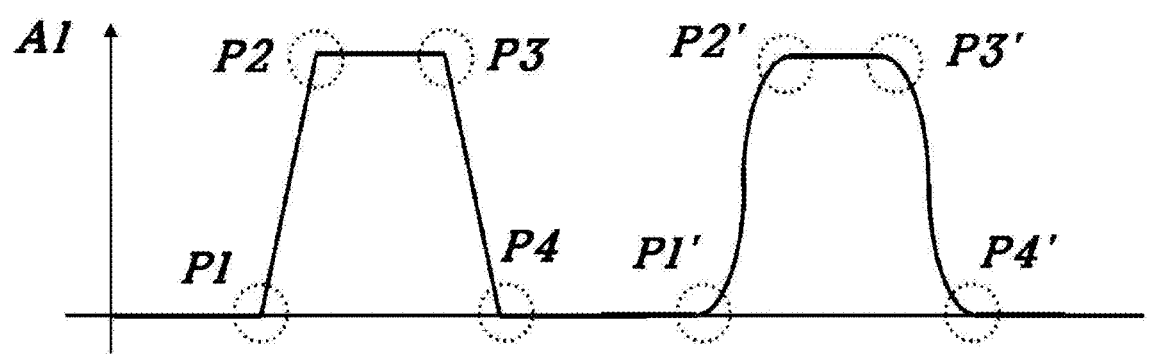
FIG. 6 shows an example of position-dependent changes in the aluminum (Al) content of low refractive index layers and high refractive index layers of DBR unit layers of the light emitting diode shown in FIG. 5 in which a first transition portion and a second transition portion in the form of quadratic curves are formed in one of the DBR unit layers. The formation of the first and second transition portions can prevent a rapid change in energy band, leading to a reduction in the electrical resistance of the DBR unit layer.

FIG. 2 is a longitudinal sectional view of a light emitting diode according to one embodiment of the present invention, FIG. 3 shows wavelength-dependent changes in the reflectance of a light emitting diode according to one embodiment of the present invention, FIG. 4 shows an example of position-dependent changes in the aluminum (Al) content of low refractive index layers and high refractive index layers of DBR unit layers constituting a second conductivity type reflective layer of a light emitting diode according to one embodiment of the present invention, FIG. 5 shows a further example of position-dependent changes in the aluminum (Al) content of low refractive index layers and high refractive index layers of DBR unit layers constituting a second conductivity type reflective layer of a light emitting diode according to one embodiment of the present invention, and FIG. 6 shows various composition profiles of aluminum included in DBR unit layers. The light emitting diodes exemplified in these figures are flip-chip light emitting diodes. Although the following description is focused on flip-chip light emitting diodes, it should be noted that the same description is also applicable to vertical light emitting diodes. It should also be noted that the thickness of each layer in the drawings is exaggerated or schematically illustrated for convenience in description.

FIG. 2 illustrates a light emitting diode according to one embodiment of the present invention. As illustrated in FIG. 2, the light emitting diode includes a sapphire substrate 10, a first conductivity type semiconductor layer 20, an active layer 30, a second conductivity type semiconductor layer 40, a second conductivity type reflective layer 50, a first electrode 80, a reflective part as a second electrode, and a phase-matching layer 90.

Each of the first conductivity type semiconductor layer 20 and the second conductivity type semiconductor layer 40 has a front side and a back side. As illustrated, the first conductivity type semiconductor layer 20 is an n-type semiconductor layer and the second conductivity type semiconductor layer 40 is a p-type semiconductor layer. In this figure, the front and back sides of each of the first conductivity type semiconductor layer 20, the active layer 30, and the second conductivity type reflective layer 50 refer to the sides directed toward the top and bottom, respectively.

The active layer 30 is formed between the back side of the first conductivity type semiconductor layer 20 and the front side of the second conductivity type semiconductor layer 40. The active layer 30 is a layer where electrons recombine with holes to produce light. The active layer 30 may have a multiple quantum well (MQW) structure. For example, the active layer 30 may be a semiconductor layer composed of a nitride, such as InGaN, AlGaN, AlGaInN or GaN.

The first conductivity type semiconductor layer 20, the active layer 30, and the second conductivity type semiconductor layer 40 may be formed by suitable deposition and epitaxy processes, such as chemical vapor deposition (CVD), metal organic chemical vapor deposition (MOCVD), plasma-enhanced chemical vapor deposition (PECVD), molecular beam epitaxy (MBE), and hydride vapor phase epitaxy (HVPE).

The first electrode 80 is an element electrically connected to the first conductivity type semiconductor layer 20. The reflective part is formed on the back side of the second conductivity type reflective layer and functions as a second electrode. The reflective part consists of a second conductivity type intermediate layer 72 for improving ohmic contact and a reflective metal layer 74 for reflecting light of UVA and blue wavelength bands. For example, the first electrode 80 is an electrode electrically connected to the first conductivity type semiconductor layer 20 and the reflective part is electrically connected to the second conductivity type semiconductor layer 40 to function as a second electrode. Given that the second conductivity type reflective layer 50 functions as a first reflective layer, which will be explained below, the reflective metal layer 74 of the reflective part functions as a second reflective layer. The second conductivity type intermediate layer 72 may substantially have a thickness of 10 nm to 150 nm.

The second conductivity type reflective layer 50 is formed on the back side of the second conductivity type semiconductor layer 40, that is, between the back side of the second conductivity type semiconductor layer 40 and the reflective part, to reflect light of a short wavelength band entering through the second conductivity type semiconductor layer 40 from the active layer. Herein, the short wavelength is substantially from 315 nm to 420 nm.

The second conductivity type reflective layer 50 includes DBR unit layers 50a, 50b, 50c, ..., 50z. Hereinafter, the DBR unit layer 50a is explained as a representative example of the DBR unit layers but the same explanation of the DBR unit layer 50a is made for the other DBR unit layers. The DBR unit layer 50a includes a low refractive index layer 50a1 and a high refractive index layer 50a2 adjacent to each other. The low refractive index layer 50a1 and the high refractive index layer 50a2 include $Al_xGa_{1-x}N$ ($0<x\leq1$) and $Al_yGa_{1-y}N$ ($0\leq y<1$, $y<x$), respectively. The number of the DBR unit layers 50a, 50b, 50c, ..., 50z in the second conductivity type reflective layer 50 is variable and may be adjusted such that the reflectance of the second conductivity type reflective layer 50 is substantially 80% or higher. The term "adjacent" used in the explanation of the positions of the low refractive index layer 50a1 and the high refractive index layer 50a2 means that the low refractive index layer 50a1 may directly neighbor the high refractive index layer 50a2 without an intervening element therebetween or an intervening element may be present between the low refractive index layer 50a1 and the high refractive index layer 50a2.

As illustrated in FIG. 2, the low refractive index layers 50a1 and the high refractive index layers 50a2 are repeated alternately to form a continuous pattern in the DBR unit layers 50a, 50b, 50c, ..., 50z of the second conductivity type reflective layer 50.

For example, in the case where the second conductivity type semiconductor layer 40 may be, for example, a p-type semiconductor layer, the second conductivity type reflective layer 50 is a p-type DBR. The low refractive index layer 50a1 and the high refractive index layer 50a2 include $Al_xGa_{1-x}N$ ($0<x\leq1$) and $Al_yGa_{1-y}N$ ($0\leq y<1$, $y<x$), respectively, as described above, and the Al content of the low refractive index layer 50a1 is always higher than that of the high refractive index layer 50a2 because the refractive index of GaN (~2.4 in the UV band) is lower than that of AlN.

In the formulae $Al_xGa_{1-x}N$ and $Al_yGa_{1-y}N$ representing the low refractive index layer 50a1 and the high refractive index layer 50a2, respectively, x and y satisfy the relationship $0\leq y<x\leq1$. That is, the aluminum (Al) content of the low refractive index layer 50a1 is higher than that of the high refractive index layer 50a2. The compositions of the low refractive index layer 50a1 and the high refractive index layer 50a2 may vary stepwise to reduce a rapid change in energy band. Based on the above formulae, the low refractive index layer 50a1 and the high refractive index layer 50a2 may be, for example, composed of AlN and GaN, respectively.

The doping concentration of the second conductivity type dopant in the DBR unit layer 50z placed closest to the second electrode is higher than those in the other DBR unit layers. This concentration profile can improve the ohmic contact with the second electrode. For example, when the second conductivity type dopant is a p-type dopant, the DBR unit layer 50z placed closest to the p-type electrode may be a p-type semiconductor layer doped with the dopant at a high concentration up to a maximum of $5\times10^{20}$ cm$^{-3}$.

In the second conductivity type reflective layer 50, when the total doping concentration of the second conductivity type dopant in the initial three DBR unit layers 50a, 50b, and 50c placed closest to the back side of the second conductivity type semiconductor layer 40 and the total doping concentration of the second conductivity type dopant in the other DBR unit layers are defined as first and second doping concentrations, respectively, the first doping concentration may be lower than the second doping concentration. This doping concentration profile can reduce the occurrence of free-carrier absorption in the second conductivity type reflective layer 50 because free-carrier absorption occurs relatively frequently in the DBR unit layers placed relatively close to the active layer 30 compared to in the other DBR unit layers. The second doping concentration may be substantially from $1\times10^{18}$ cm$^{-3}$ to $1\times10^{21}$ cm$^{-3}$ and the first doping concentration may be substantially from $1\times10^{16}$ cm$^{-3}$ to $5\times10^{17}$ cm$^{-3}$. For example, the thickness of the second conductivity type reflective layer 50 may be substantially from 60 nm to 1500 nm and each DBR unit layer (for example, 50a) may be substantially from 60 nm to 100 nm. In the DBR unit layer (for example, 50a), each of the low refractive index layer 50a1 and the high refractive index layer 50a2 may be substantially from 30 nm to 50 nm.

The phase-matching layer 90 is added between the second conductivity type semiconductor layer 40 and the second conductivity type reflective layer 50 to maximize the effective reflectance of the reflective layers. As in the initial three DBR unit layers 50a, 50b, and 50c, the doping concentration of the second conductivity type dopant in the phase-matching layer 90 is also maintained at a lower level than the second doping concentration. This concentration profile can reduce the occurrence of free-carrier absorption. For example, the second doping concentration may be substantially from $1\times10^{18}$ cm$^{-3}$ to $1\times10^{21}$ cm$^{-3}$ and the doping concentrations of the second conductivity type dopant both in the initial three DBR unit layers 50a, 50b, and 50c and in the phase-matching layer may be substantially from $1\times10^{16}$ cm$^{-3}$ to $5\times10^{17}$ cm$^{-3}$. For example, the phase-matching layer 90 may include $Al_xGa_{1-x}N$ (0<x<1) and may have a thickness of 5 nm to 50 nm As described above, the light emitting diode of the present invention is constructed to include the second conductivity type reflective layer 50 as a first reflective layer for reflecting light of a UVA wavelength band and the reflective metal layer 74 as a second reflective layer for reflecting light of a UVA wavelength band and light of a blue wavelength band. Due to this construction, the light emitting diode of the present invention has high reflectance in a broad wavelength region, including UVA and blue wavelength bands, achieving further improved light extraction efficiency. Furthermore, the conductivity type DBR reflects light propagating through the p-type semiconductor layer, achieving improved light efficiency. The formation of the conductivity type DBR can advantageously eliminate the need for additional processes for the formation of a non-conductivity type DBR and current paths.

Referring next to FIG. 3, wavelength-dependent changes in the reflectance of the light emitting diode illustrated in FIG. 2 will be discussed. Section 1 (S1) is a wavelength band shorter than Section 2 (S2). Section 1 and shorter sections correspond to UVB and UVC wavelength bands that are not used in white light emitting diodes. Section 2 is a portion of the UVA wavelength band (315 nm to 420 nm) and is mostly reflected from the second conductivity type reflective layer 50 illustrated in FIG. 2. In this wavelength band, the second conductivity type reflective layer 50 shows a reflectance of 90% (0.9), which is given by the red curve in Section 2. Section 3 corresponds to a portion of the UVA wavelength band and the blue wavelength band. In this section, light is reflected from the reflective metal layer 74, as given by the grey graph. The grey graph is obtained when silver is used as a material for the reflective metal layer 74. In conclusion, the second conductivity type reflective layer 50 as a first reflective layer reflects light of a UVA wavelength band and the reflective metal layer 74 as a second reflective layer reflects light of a UVA wavelength band and light of a blue wavelength band such that the light emitting diode has high reflectance in a broad wavelength band, including UVA, achieving further improved light extraction efficiency.

In the light emitting diode illustrated in FIG. 2, the low refractive index layer 50a1 and the high refractive index layer 50a2 of each of the DBR unit layers (for example, 50a) include $Al_xGa_{1-x}N$ (0<x≤1) and $Al_yGa_{1-y}N$ (0≤y<1, y<x), respectively. The aluminum (Al) content of the second conductivity type reflective layer 50 may vary and some examples thereof are graphically shown in FIGS. 4 to 6. In each graph, the x-axis shows the position of the second conductivity type reflective layer 50 and the y-axis shows the Al content when the second conductivity type reflective layer 50 is positioned vertically.

Referring to FIG. 4, a represents the low refractive index layer 50a1, b represents the high refractive index layer 50a2, and the sum a+b is the DBR unit 50a. The low refractive index layer 50a1 is substantially an AlN layer where the Al content is highest and the high refractive index layer 50a2 is substantially a GaN layer where the Al content is lowest. Accordingly, the AlN and GaN layers are repeated in an alternating pattern in the second conductivity type reflective layer 50.

Referring next to FIG. 5, each of the DBR unit layers of the second conductivity type reflective layer 50 includes a first transition portion t1 formed between the low refractive index layer 50a1 and the high refractive index layer 50a2 and whose Al content gradually decreases from the front to the back and a second transition portion t2 formed between the high refractive index layer 50a2 and the low refractive index layer 50a1 of the next adjacent DBR unit layer (50b of FIG. 2) and whose Al content gradually increases from the front to the back. In FIG. 5, the low refractive index layer is represented by 0.5t2+a+0.5t1, the high refractive index layer is represented by 0.5t1+b+0.5t2, and the thickness of one DBR unit layer is represented by a+b+t1+t2. Considering the relation with wavelength, the DBR unit layer may be designed such that the optical thickness (i.e. a+b+t1+t2) is $\lambda/2$. Each of the low refractive index layer 50a1 and the high refractive index layer 50a2 of the DBR unit layer may be designed to have a thickness of $\lambda/4$. The Al content profile of each of the first transition portion t1 and the second transition portion t2 may vary, for example, linearly or in the form of a quadratic curve.

The starting point P3 and the end point P4 of the first transition portion t1 and the starting point P1 and the end point P2 of the second transition portion t2 are heterojunctions where the content of Al is changed rapidly rather than gradually. Only these points can be subjected to delta doping to prevent a rapid change in energy band. Although the Al content profiles have been explained herein with reference to the drawings, the Ga content also varies in response to the Al content because the DBR unit layers are composed of $Al_xGa_{1-x}N$ (0<x≤1) and $Al_yGa_{1-y}N$ (0≤y<1, y<x).

Generally, delta doping is a technique to obtain a doping profile that looks like a delta function. During doping in the second conductivity type reflective layer 50, high background doping leads to an overall increase in the occurrence of free-carrier absorption. In the present invention, the occurrence of free-carrier absorption can be prevented by adjusting the second doping concentration to the level of $1\times10^{18}$ cm$^{-3}$ to $1\times10^{21}$ cm$^{-3}$ and applying delta doping to only the portions, i.e. the transition portions t1 and t2, where the content of Al varies. The adjustment of the second doping concentration and the delta doping can reduce a rapid change in energy band with varying Al content, leading to a reduction in the resistance of the second conductivity type reflective layer 50.

As is apparent from the foregoing, the new concept of light emitting diode of the present invention does not require the use of a reflective metal electrode, such as a silver or aluminum electrode that is not suitable for the formation of current paths due to its poor mechanical/electrical connection to a p-type semiconductor layer, unlike conventional light emitting diodes in which a non-conductivity type DBR is formed on a p-type semiconductor. In addition, the light efficiency of the light emitting diode according to the present invention can be considerably improved without the need to use an additional reflective metal layer.

What is claimed is:

1. A light emitting diode comprising:
a first conductivity type semiconductor layer having a front side and a back side;
a second conductivity type semiconductor layer having a front side and a back side;
an active layer formed between the back side of the first conductivity type semiconductor layer and the front side of the second conductivity type semiconductor layer;
a second conductivity type reflective layer formed on the back side of the second conductivity type semiconductor layer; and
a reflective part formed on the back side of the second conductivity type reflective layer opposite the second conductivity type semiconductor layer to reflect light of a short wavelength (UVA wavelength) band and light of a blue wavelength band and electrically connected to the second conductivity type semiconductor layer,
wherein the reflective part comprises a second conductivity type intermediate layer for improving ohmic contact and a reflective metal layer for reflecting light of the short wavelength band and light of the blue wavelength band.

2. The light emitting diode according to claim 1, further comprising a phase-matching layer between the second conductivity type semiconductor layer and the second conductivity type reflective layer.

3. The light emitting diode according to claim 1, wherein the reflective metal layer comprises silver.

4. The light emitting diode according to claim 1, further comprising a sapphire substrate located on the front side of the first conductivity type semiconductor layer.

5. The light emitting diode according to claim 1, wherein the first conductivity type semiconductor layer is an n-type semiconductor layer and the second conductivity type semiconductor layer is a p-type semiconductor layer.

6. The light emitting diode according to claim 1, wherein the second conductivity type reflective layer comprises distributed Bragg reflector (DBR) unit layers for reflecting light of a short wavelength band of 315 nm to 420 nm, each of the DBR unit layers comprises a low refractive index layer and a high refractive index layer adjacent to the low refractive index layer, the low refractive index layer and the high refractive index layer comprise $Al_xGa_{1-x}N$ ($0<x\leq 1$) and $Al_yGa_{1-y}N$ ($0\leq y<1$, $y<x$), respectively, each of the DBR unit layers of the second conductivity type reflective layer comprises a first transition portion formed between the low refractive index layer and the high refractive index layer and whose Al content gradually decreases from the front to the back and a second transition portion formed between the high refractive index layer and the low refractive index layer of the next adjacent DBR unit layer and whose Al content gradually increases from the front to the back.

7. The light emitting diode according to claim 6, wherein delta doping is applied to the starting and end points of each of the first transition portion and the second transition portion.

8. The light emitting diode according to claim 1, wherein the second conductivity type reflective layer has a thickness of 60 nm to 1500 nm.

9. The light emitting diode according to claim 1, wherein the second conductivity type intermediate layer has a thickness of 10 nm to 150 nm.

10. The light emitting diode according to claim 2, wherein the phase-matching layer comprises $Al_xGa_{1-x}N$ ($0<x<1$).

11. The light emitting diode according to claim 2, wherein the phase-matching layer has a thickness of 5 nm to 50 nm.

12. The light emitting diode according to claim 6, wherein the Al content profile of each of the first transition portions and the second transition portions is linear or a quadratic curve.

* * * * *